United States Patent
Lee et al.

(10) Patent No.: US 10,811,469 B2
(45) Date of Patent: Oct. 20, 2020

(54) ORGANIC LIGHT EMITTING DIODE DISPLAY DEVICE

(71) Applicant: LG Display Co., Ltd, Seoul (KR)

(72) Inventors: Kang-Ju Lee, Paju-si (KR); Seung-Ryong Joung, Paju-si (KR); Seong-Su Jeon, Paju-si (KR); Tae-Shick Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/539,694

(22) Filed: Aug. 13, 2019

(65) Prior Publication Data
US 2020/0058709 A1    Feb. 20, 2020

(30) Foreign Application Priority Data
Aug. 14, 2018  (KR) .................... 10-2018-0095139

(51) Int. Cl.
*H01L 51/50* (2006.01)
*H01L 27/32* (2006.01)
*H01L 51/52* (2006.01)

(52) U.S. Cl.
CPC ........ *H01L 27/322* (2013.01); *H01L 27/3246* (2013.01); *H01L 51/5012* (2013.01); *H01L 51/5275* (2013.01)

(58) Field of Classification Search
USPC ...... 257/13, 79–103, 918, 40, 642–643, 759
See application file for complete search history.

(56) References Cited

U.S. PATENT DOCUMENTS

| | | | |
|---|---|---|---|
| 2009/0146552 A1 | 6/2009 | Spindler et al. | |
| 2010/0033828 A1* | 2/2010 | Lee | G02B 5/045 359/618 |
| 2015/0034923 A1 | 2/2015 | Kim et al. | |
| 2015/0188073 A1* | 7/2015 | Ahn | H01L 27/3209 257/40 |
| 2017/0084856 A1* | 3/2017 | Kum | H01L 51/504 |
| 2017/0092887 A1 | 3/2017 | Lee et al. | |
| 2017/0155094 A1* | 6/2017 | Joung | H01L 51/5225 |
| 2018/0166644 A1 | 6/2018 | Youn et al. | |
| 2018/0205029 A1 | 7/2018 | Song et al. | |
| 2018/0212178 A1 | 7/2018 | Han et al. | |

FOREIGN PATENT DOCUMENTS

| | | |
|---|---|---|
| JP | 2007-12369 A | 1/2007 |
| KR | 10-2016-0084282 A | 7/2016 |
| KR | 10-2017-0038322 A | 4/2017 |

* cited by examiner

*Primary Examiner* — Moin M Rahman
(74) *Attorney, Agent, or Firm* — Birch, Stewart, Kolasch & Birch, LLP

(57) ABSTRACT

An organic light emitting diode display device includes: an overcoating layer on a substrate having an emitting area and a non-emitting area and including a plurality of convex portions and a plurality of concave portions; a first electrode on the overcoating layer; a light emitting layer on the first electrode and including a first emitting material layer; and a second electrode on the light emitting layer, wherein the light emitting layer includes first, second and third emitting material layers sequentially under the second electrode, and wherein the first emitting material layer emits a first light of a first wavelength, the second emitting material layer emits the first light of the first wavelength, and the third emitting material layer emits a second light of a second wavelength different from the first wavelength.

18 Claims, 4 Drawing Sheets

ORGANIC LIGHT EMITTING DIODE DISPLAY DEVICE

CROSS REFERENCE TO RELATED APPLICATIONS

The present application claims the priority benefit of Korean Patent Application No. 10-2018-0095139 filed in Republic of Korea on Aug. 14, 2018, the disclosure of which is hereby incorporated by reference in its entirety for all purposes as if fully set forth herein.

BACKGROUND OF THE INVENTION

Field of the Invention

The present invention relates to an organic light emitting diode display device, and more particularly, to an organic light emitting diode display device where a light extraction efficiency is improved.

Discussion of the Related Art

Recently, with the advent of an information-oriented society, as interest in information displays for processing and displaying a massive amount of information and demand for portable information media have increased, a display field has rapidly advanced. Thus, various light and thin flat panel display devices have been developed and highlighted.

Among the various flat panel display devices, an organic light emitting diode (OLED) display device is an emissive type device and does not require a backlight unit used in a non-emissive type device such as a liquid crystal display (LCD) device. As a result, the OLED display device has a light weight and a thin profile.

In addition, the OLED display device has advantages of a viewing angle, a contrast ratio, and power consumption as compared with the LCD device. Furthermore, the OLED display device can be driven with a low direct current (DC) voltage and has rapid response speed. Moreover, since inner elements of the OLED display device have a solid phase, the OLED display device has high durability against an external impact and has a wide available temperature range.

In the OLED display device, while light emitted from a light emitting layer passes through various components and is emitted to an exterior, a large amount of the light is lost. As a result, the light emitted to the exterior of the OLED display device is only 20% of the light emitted from the light emitting layer.

Here, since the amount of the light emitted from the light emitting layer is increased along with the amount of a current applied to the OLED display device, it is possible to further increase luminance of the OLED display device by applying more currents to the light emitting layer. However, in this case, power consumption is increased, and lifetime of the OLED display device is also reduced.

Therefore, to improve a light extraction efficiency of the OLED display device, an OLED display device where a microlens array (MLA) is attached to an outer surface of a substrate or a microlens is formed in an overcoating layer has been suggested.

However, even when the microlens array is attached to the outer surface of the OLED display device or the microlens is formed in the OLED display device, a large amount of light is confined in the OLED display device and only a small amount of light is extracted to an exterior.

SUMMARY OF THE INVENTION

Accordingly, the present invention is directed to an organic light emitting diode display device that substantially obviates one or more of the problems due to limitations and disadvantages of the related art.

An object of the present invention is to provide an organic light emitting diode display device where a light extraction efficiency is improved and a lifetime is extended.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode display device includes: a substrate; an overcoating layer on the substrate and including a plurality of convex portions and a plurality of concave portions; a first electrode on the overcoating layer; a light emitting layer on the first electrode; and a second electrode on the light emitting layer, wherein the light emitting layer includes first, second and third emitting material layers sequentially under the second electrode, and wherein the first emitting material layer emits a first light of a first wavelength, the second emitting material layer emits the first light of the first wavelength, and the third emitting material layer emits a second light of a second wavelength different from the first wavelength.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the present disclosure, examples of which are illustrated in the accompanying drawings.

Figure 1:
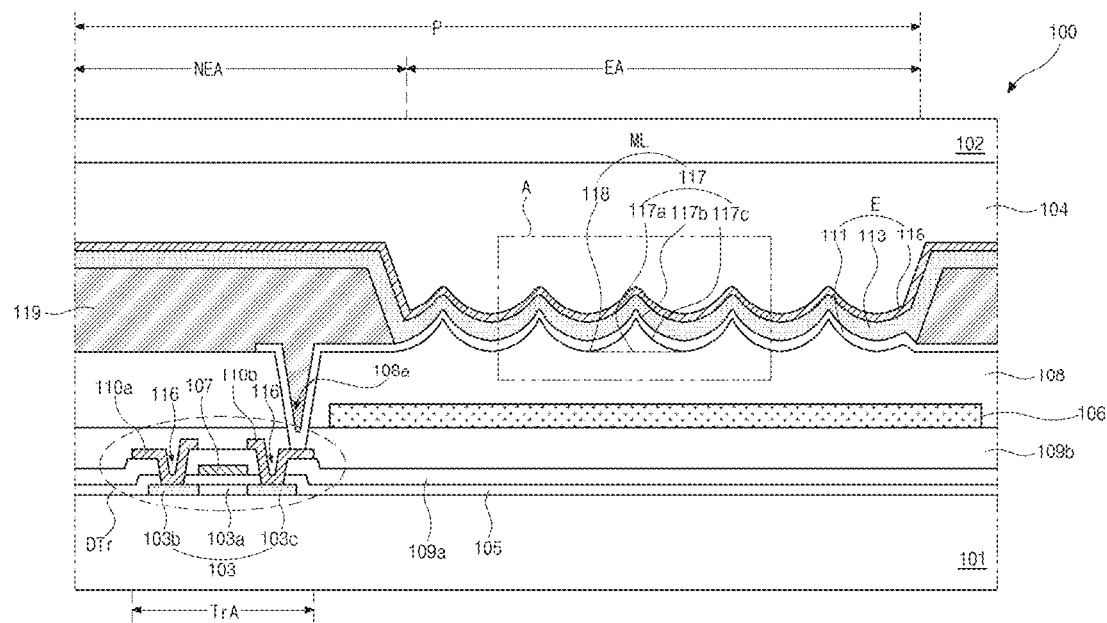
FIG. 1 is a cross-sectional view showing an organic light emitting diode display device according to a first embodiment of the present disclosure.

FIG. 1 is a cross-sectional view showing an organic light emitting diode display device according to a first embodiment of the present disclosure. All the components of the organic light emitting diode display devices according to all embodiments of the present disclosure are operatively coupled and configured.

In FIG. 1, an organic light emitting diode (OLED) display device 100 can have a top emission type or a bottom emission type according to an emission direction of a light. A bottom emission type OLED display device can be exemplarily illustrated hereinafter. All of elements of the organic light emitting diode (OLED) display device 100 are operatively coupled and configured.

The OLED display device 100 includes a substrate having a driving thin film transistor (TFT) DTr and a light emitting diode E thereon and a protecting film 102 encapsulating the substrate 101.

The substrate 101 includes a plurality of pixel regions P and each pixel region P includes an emitting area EA where the light emitting diode E is disposed and an image is substantially displayed and a non-emitting area NEA along an edge of the emitting area EA. The non-emitting area NEA includes a switching area TrA where the driving TFT DTr is disposed.

A semiconductor layer 103 is disposed in the switching area TrA of the non-emitting area NEA of the pixel region P on the substrate 101. The semiconductor layer 103 can include silicon and can have an active region 103a in a central portion and source and drain regions 103b and 103c in both side portions of the active region 103a. The active region 103a can function as a channel of the driving TFT DTr, and the source and drain regions 103b and 103c can be doped with impurities of a relatively high concentration.

A gate insulating layer 105 is disposed on the semiconductor layer 103.

A gate electrode 107 and a gate line (not shown) are disposed on the gate insulating layer 105. The gate electrode 107 corresponds to the active region 103a of the semiconductor layer 103, and the gate line is connected to the gate electrode 107 to extend along one direction.

A first interlayer insulating layer 109a is disposed on the gate electrode 107 and the gate line. The first insulating layer 109a and the gate insulating layer 105 has first and second semiconductor contact holes 116 exposing the source and drain regions 103b and 103c in both side portions of the active region 103a.

Source and drain electrodes 110a and 110b spaced apart from each other are disposed on the first interlayer insulating layer 109a having the first and second semiconductor contact holes 116. The source electrode 110a is connected to the source region 103b through the first semiconductor contact hole 116, and the drain electrode 110b is connected to the drain region 103c through the second semiconductor contact hole 116.

A second interlayer insulating layer 109b is disposed on the source and drain electrodes 110a and 110b and the first interlayer insulating layer 109a exposed between the source and drain electrodes 110a and 110b.

The source and drain electrodes 110a and 110b, the semiconductor layer 103 including the source and drain regions 103b and 103c contacting the source and drain electrodes 110a and 110b, respectively, the gate insulating layer 105 and the gate electrode 107 constitute the driving TFT DTr.

Although not shown, a data line can be disposed on the second interlayer insulating layer 109b. The data line can cross the gate line to define each pixel region P. A switching TFT having the same structure as the driving TFT DTr can be connected to the driving TFT DTr.

The switching TFT and the driving TFT DTr can exemplarily have one of an amorphous silicon (a-Si) TFT, a polycrystalline silicon (p-Si) TFT, a single crystal silicon (c-Si) TFT and an oxide TFT according to the semiconductor layer 103. Although the switching TFT and the driving TFT DTr in the first embodiment of FIG. 1 have a top gate type where the semiconductor layer 103 includes polycrystalline silicon or an oxide semiconductor material, the switching TFT and the driving TFT DTr can have a bottom gate type where the semiconductor layer 103 includes intrinsic amorphous silicon and impurity-doped amorphous silicon in another embodiment.

When the semiconductor layer 103 includes the oxide semiconductor material, a light shielding layer (not shown) can be disposed under the semiconductor layer 103 of the oxide semiconductor material, and a buffer layer (not shown) can be disposed between the light shielding layer and the semiconductor layer 103.

A wavelength converting layer 106 is disposed on the second interlayer insulating layer 109b corresponding to the emitting area EA of each pixel region P.

The wavelength converting layer 106 can include a color filter transmitting only a light having a wavelength of a predetermined color corresponding to each pixel region P among a white light emitted from the light emitting diode E to the substrate 101.

The wavelength converting layer 106 can transmit only a light having a wavelength corresponding to a red color, a green color or a blue color. For example, in the OLED display device 100, a single unit pixel region can include red, green and blue pixel regions P, and the wavelength converting layer 106 in the red, green and blue pixel regions P can include red, green and blue color filters, respectively.

In the OLED display device 100, the single unit pixel region can further include a white pixel region where the wavelength converting layer 106 is not disposed.

In another embodiment, the wavelength converting layer 106 can include a quantum dot which have a size capable of emitting a light of a predetermined color corresponding to each pixel region P according to a white light emitted from the light emitting diode E to the substrate 101. Here, the quantum dot can include at least one selected from a group including CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP. GaInNAs, GaInPAs, InAlNP, InAlNAs, InAlPAs and SbTe. However, a material of the quantum dot is not limited thereto.

For example, the wavelength converting layer 106 in the red pixel region can include a quantum dot of CdSe or InP, the wavelength converting layer 106 in the green pixel region can include a quantum dot of CdZnSeS, and the wavelength converting layer 106 in the blue pixel region can include a quantum dot of ZnSe. The OLED display device 100 where the wavelength converting layer 106 includes a quantum dot can have a relatively high color reproducibility.

In another embodiment, the wavelength converting layer 106 can include a color filter containing a quantum dot.

An overcoat layer 108 which has a first drain contact hole 108a exposing the drain electrode 110b with the second interlayer insulating layer 109b is disposed on the wavelength converting layer 106. The overcoating layer 108 has a plurality of concave portions 118 and a plurality of convex portions 117 on a top surface thereof. The plurality of concave portions 118 and the plurality of convex portions 117 are alternately disposed with each other to constitute a microlens ML.

The overcoating layer 108 can include an insulating material having a refractive index of 1.5. For example, the overcoating layer 108 can include one of acrylic resin, epoxy resin, phenol resin, polyamide resin, polyimide resin, unsaturated polyester resin, polyphenylene resin, polyphenylenesulfide resin, benzocyclobutene and photoresist. However, a material of the overcoating layer 108 is not limited thereto.

The plurality of convex portions 117 can have a structure to define or surround the plurality of concave portions 118, respectively, and can have a bottom surface portion 117a, a top surface portion 117b and a side surface portion 117c.

The side surface portion 117c can be an entire or a whole of a slanted surface constituting the top surface portion 117b. A slope of the side surface portion 117c can increase from the bottom surface portion 117a to the top surface portion 117b such that the side surface portion 117c can have a maximum slope Smax at a portion adjacent to the top surface portion 117b.

Since a path of a light emitted from the light emitting layer 113 is changed toward the substrate 101 by the plurality of convex portions 117, the light extraction efficiency of the OLED display device 100 increases.

A first electrode 111 connected to the drain electrode 110b of the driving TFT DTr is disposed on the overcoating layer 108 constituting the microlens ML. For example, the first electrode 111 can be an anode of the light emitting diode E and can include a material having a relatively high work function.

The first electrode 111 is disposed in each pixel region P, and a bank 119 is disposed between the first electrodes 111 in the adjacent pixel regions P. The first electrode 111 is separated in each pixel region P with the bank 119 as a border between the adjacent pixel regions P.

The bank 119 includes an opening exposing the first electrode 111, and the opening of the bank 119 is disposed to corresponds to the emitting area EA. The plurality of convex portions 117 and the plurality of concave portions 118 constituting the microlens ML are disposed in an entire or a whole of the opening of the bank 119. For example, the plurality of convex portions 117 and the plurality of concave portions 118 can contact an edge portion of the bank 119.

Further, the opening of the bank 119 is disposed to correspond to the wavelength converting layer 106. For example, the edge portion of the bank 119 can overlap an edge portion of the wavelength converting layer 106. Since the wavelength converting layer 106 overlaps the bank 119, a leakage of a light not passing through the wavelength converting layer 106 is prevented. In embodiments, the plurality of convex portions 117 and the plurality of concave portions 118 can be located to correspond to the wavelength converting layer 106. The wavelength converting layer 106 can be interposed between the substrate 101 and the overcoating layer 108. In embodiments, the plurality of convex portions 117 can be more distal to the substrate 101 than the plurality of concave portions 118.

A light emitting layer 113 is disposed on the first electrode 111. The light emitting layer 113 can have a single layer of an emitting material. Alternatively, the light emitting layer 113 can have a multiple layer including a hole injecting layer, a hole transporting layer, an emitting material layer, an electron transporting layer and an electron injecting layer for increasing an emission efficiency.

The first electrode 111 and the light emitting layer 113 sequentially on the overcoating layer 108 can have a shape according to a morphology of the plurality of convex portions 117 and the plurality of concave portions 118 of the top surface of the overcoating layer 108 to constitute the microlens ML.

The light emitting layer 113 can have different thicknesses in the convex portion 117 and the concave portion 118 of the microlens ML.

The thickness of the light emitting layer 113 in a region corresponding to the side surface portion 117c of the convex portion 117 of the microlens ML can be smaller than the thickness of the light emitting layer 113 in a region corresponding to the concave portion 118 of the microlens ML. The thickness of the light emitting layer 113 can be defined as a length perpendicular to a tangential line C1 and C2 (of FIG. 2) of the top and bottom surfaces of the light emitting layer 113.

In the OLED display device 100, since the light emitting layer 113 has different thicknesses in the convex portion 117 and the concave portion 118 constituting the microlens ML, a distance from the second electrode 115 to the emitting material layers 203a, 203b and 203c (of FIG. 3) of the light emitting layer 113 in the concave portion 118 of the microlens ML is different from a distance from the second electrode 115 to the emitting material layers 203a, 203b and 203c of the light emitting layer 113 in the side surface portion 117c of the convex portion 117 of the microlens ML.

Accordingly, in the OLED display device 100, the emitting material layers 203a, 203b and 203c are disposed at a predetermined location in the light emitting layer 113 constituting the microlens ML.

Since the emitting material layers 203a, 203b and 203c are disposed at specific positions in the light emitting layer 113 constituting the microlens ML, the light extraction efficiency of the light emitted from the light emitting diode E increases.

A second electrode 115 is disposed on an entire or a whole of the light emitting layer 113. For example, the second electrode 115 can be a cathode.

The second electrode 115 can have a shape according to a morphology of the plurality of convex portions 117 and the plurality of concave portions 118 of the top surface of the overcoating layer 108 to constitute the microlens ML.

When a voltage is applied to the first and second electrodes 111 and 115 according to a signal, a hole injected from the first electrode 111 and an electron injected from the second electrode 115 are transmitted to the light emitting layer 113 to constitute an exciton. When the exciton transitions from an excited state to a ground state, a light can be emitted from the light emitting layer 113 as a visible ray.

The light of the light emitting layer 113 can pass through the transparent first electrode 111 to be emitted toward an exterior such that an image is displayed.

Since the overcoating layer 108 constitutes the microlens ML, the light confined in the interior of the light emitting layer 113 due to a total reflection can be transmitted with an angle smaller than a critical angle of the total reflection by the microlens ML of the overcoating layer 108 to be extracted to the exterior by a multiple reflection. As a result, the light extraction efficiency of the OLED lighting apparatus 100 is improved.

In addition, since the microlens ML of the overcoating layer 108, the first electrode 111, the light emitting layer 113 and the second electrode 115 is disposed in an entire or a whole of the opening of the bank 119 corresponding to the emitting area EA, the entire or the whole of the emitting area EA is used for the microlens ML and the light extraction efficiency is maximized.

A protecting film 102 of a thin film type is disposed on the driving TFT DTr and the light emitting diode E, and a face seal 104 is disposed between the light emitting diode E and the protecting film 102. The face seal 104 can include an organic material or an inorganic material which is transparent and has an adhesive property. The protecting film 102 and the substrate 101 can be attached to each other by the face seal 104 to encapsulate the OLED display device 100.

To prevent penetration of an external oxygen and a moisture into an interior of the OLED display device 100, the protecting film 102 can include at least two inorganic protecting films. An organic protecting film for supplementing impact resistance of the at least two inorganic protecting films can be interposed between the at least two inorganic protecting films.

In the structure where the organic protecting film and the inorganic protecting film are alternately laminated with each other, the inorganic protecting film can completely wrap the organic protecting film such that penetration of the moisture and the oxygen through a side surface of the organic protecting film is prevented.

As a result, penetration of the moisture and the oxygen from the exterior to the interior of the OLED display device 100 can be prevented.

In the OLED display device 100, a polarizing plate (not shown) for preventing reduction of a contrast ratio due to an external light can be disposed on an outer surface of the transparent substrate 101. Since the polarizing plate blocking the external light is disposed on a surface of the OLED display device 100 in a driving mode where a light from the light emitting layer 113 is emitted, the contrast ratio increases.

In the OLED display device 100, since the emitting material layers 203a, 203b and 203c are disposed at predetermined positions in the light emitting layer 113 constituting the microlens ML due to the overcoating layer 108, the light extraction efficiency of the light emitted from the light emitting diode E increases.

Figure 2:
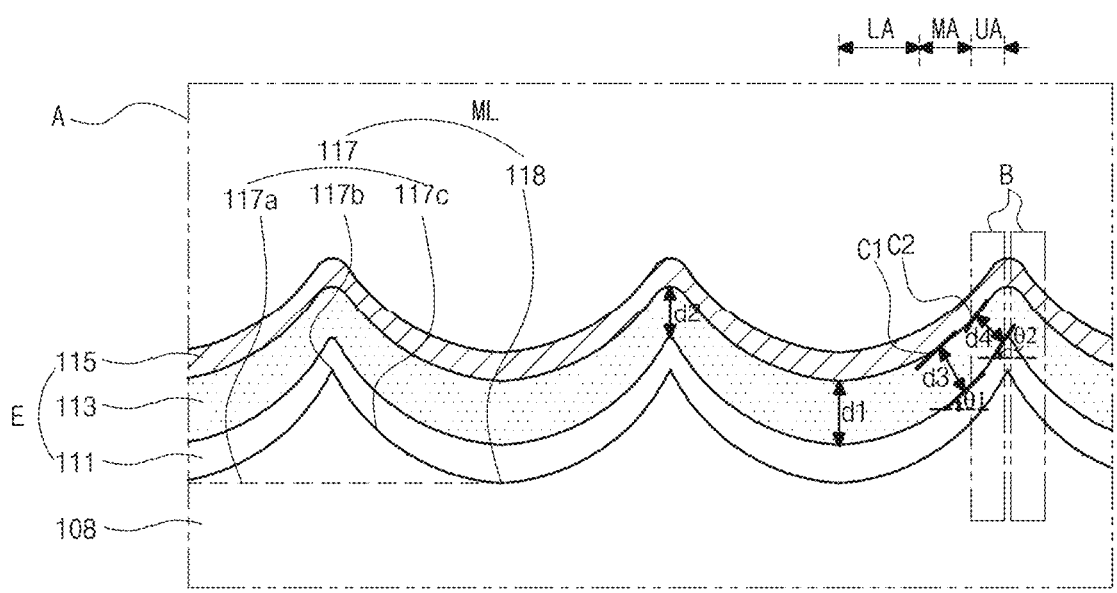
FIG. 2 is a magnified view of A of FIG. 1.

FIG. 2 is a magnified view of A of FIG. 1.

In FIG. 2, the first electrode 111, the light emitting layer 113 and the second electrode 115 are sequentially disposed on the overcoating layer 108 having the microlens ML of the plurality of concave portions 118 and the plurality of convex portions 117 alternating with each other. The first electrode 111, the light emitting layer 113 and the second electrode 115 constitute the light emitting diode E.

The first electrode 111, the light emitting layer 113 and the second electrode 115 sequentially on the overcoating layer 108 have a shape according to a morphology of the top surface of the overcoating layer 108 to constitute the microlens ML.

Each convex portion 117 can have a bottom surface portion 117a, a top surface portion 117b and a side surface portion 117c. The side surface portion 117c can be an entire or a whole of a slanted surface constituting the top surface portion 117c.

The side surface portion 117c can be divided into a lower region LA, a middle region MA and an upper region UA according to a total height H between the bottom surface portion 117a and the top surface portion 117b. The lower region LA can be defined as a region from the bottom surface portion 117a to a half of the total height H (H/2). The middle region MA between the lower region LA and the upper region UA can be defined as a region from the half of the total height H (H/2) to four fifth of the total height H (4H/5). The upper region UA can be defined as a region from the four fifth of the total height H (4H/5) to the top surface portion 117b.

To further increase the light extraction efficiency of the light emitting layer 113, the convex portion 117 of the overcoating layer 108 can have a structure where the top surface portion 117b has a sharp shape or a tip. For example, the convex portion 117 can have a cross-section of triangle shape including a vertex corresponding to the top surface portion 17b, a bottom side corresponding to the bottom surface portion 117a and a hypotenuse corresponding to the side surface portion 117c.

An angle $\theta 1$ and $\theta 2$ of the side surface portion 117c of the convex portion 117 of the overcoating layer 108 can gradually increase from the bottom surface portion 117a to the top surface portion 117b. The angle $\theta 1$ and $\theta 2$ is defined as an angle between the tangential line C1 and C2 of the side surface portion 117c and a horizontal surface (i.e., the bottom surface portion 117a). The side surface portion 117c can have the maximum slope Smax when the angle $\theta 1$ and $\theta 2$ becomes the maximum value. The slope can be defined by a tangent value of the angle ($\tan \theta$).

Since the angle $\theta 1$ and $\theta 2$ of the side surface portion 117c gradually increases from the bottom surface portion 117a to the top surface portion 117b, the side surface portion 117c of the convex portion 117 of the overcoating layer 108 has the maximum slope Smax in the upper region UA adjacent to the top surface portion 117b.

The first electrode 111, the light emitting layer 113 and the second electrode 115 on the overcoating layer 108 having the microlens ML of the concave portion 118 and the convex portion 117 have the microlens ML on the top surface thereof. The convex portion 117 can include the bottom surface portion 117a, the tope surface portion 117b and the side surface portion 117c, and the side surface portion 117c can include the upper region UA, the middle region MA and the lower region LA.

In the OLED display device 100, since the light emitting layer 113 is disposed on the overcoating layer 108 constituting the microlens ML, the light emitting layer 113 can have different thicknesses d1, d2, d3 and d4 in different regions. The light emitting layer 113 can be formed to have the different thicknesses d1, d2, d3 and d4 corresponding to the concave portion 118 and the convex portion 117 of the microlens ML.

The thickness of the light emitting layer 113 can be defined as a length perpendicular to the tangential line C1 and C2 of the light emitting layer 113. For example, the third and fourth thicknesses d3 and d4 of the light emitting layer 113 of the side surface portion 117c of the convex portion 117 of the microlens ML can be smaller than the first and second thicknesses d1 and d2 of the light emitting layer 113 of the concave portion 118 and the top surface portion 117b of the convex portion 117.

The thickness d3 and d4 of the light emitting layer 113 of the side surface portion 117c of the convex portion 117 can gradually decrease from the lower region LA to the upper region UA.

Since the light emitting layer 113 is formed on the overcoating layer 108 having the microlens ML, the side surface portion 117c of the convex portion 117 of the overcoating layer 108 can have the angle $\theta 1$ and $\theta 2$ gradually increasing from the bottom surface 117a to the top surface portion 117b. As a result, the third and fourth thicknesses d3 and d4 of the light emitting layer 113 of the side surface portion 117c are smaller than the first and second thicknesses d1 and d2 of the light emitting layer 113 of the concave portion 118 and the top surface portion 117b.

Since the angle θ1 and θ2 of the side surface portion 117c gradually increases from the lower region LA to the upper region UA, the light emitting layer 113 of the side surface portion 117c can have the fourth thickness d4 as the minimum value in the upper region UA where the angle θ2 has a relatively great value and can have the third thickness d3 as the maximum value in the middle region MA where the angle θ1 has a relatively small value.

For example, the first thickness d1 can be equal to or greater than the second thickness d2, the second thickness d2 can be greater than the third thickness d3, and the third thickness d3 can be greater than the fourth thickness d4, e.g., d1≥d2>d3>d4.

In the light emitting diode E, the light emission occurs in a region having a relatively high current density. Since the light emitting layer 113 has a relatively small thickness d4 in the upper region UA of the convex portion 117, the light emitting layer 113 can have a relatively high current density and a relatively strong light emission in the upper region UA of the convex portion 117. In addition, since the light emitting layer 113 has a relatively great thickness d in the lower region LA of the convex portion 117, the light emitting layer 113 can have a relatively low current density and a relatively weak light emission in the lower region LA of the convex portion 117. As a result, the upper region UA of each of the plurality of convex portions 117 where the relatively strong light emission occurs can be defined as an effective emission region B. When the light emitting diode E is driven, an electric field is locally concentrated on the effective emission region B. As a result, a main current path is constituted and a main emission occurs in the effective emission region B.

The light emitting layer 113 has the main emission in the effective emission region B having a relatively small thickness d4 as compared with the top surface portion 117b of the convex portion 117 and the concave portion 118. Since the emitting material layers 203a, 203b and 203c are disposed at predetermined positions in the light emitting layer 113 based on the thickness of the light emitting layer 113 in the effective emission region B, the light extraction efficiency of the light emitted from the light emitting diode E increases.

When the positions of the emitting material layers 203a, 203b and 203c are determined in the light emitting layer 113 based on the effective emission region B of the light emitting layer 113 constituting the microlens ML, the position of the emitting material layers 203a, 203b and 203c can be determined to satisfy a condition for a cavity peak of an optical property.

The cavity peak can be defined as a maximum optical intensity. For example, a light generated between two mirrors can have the cavity peak at a position where the light has a maximum intensity due to a constructive interference of the reflected lights.

The position of the cavity peak can be determined according to a wavelength of the light. The position of the cavity peak in the first electrode 111, the light emitting layer 113 and the second electrode 115 having a flat structure is different from the position of the cavity peak in the first electrode 111, the light emitting layer 113 and the second electrode 115 constituting the microlens ML.

In the OLED display device 100, since the emitting material layers 203a, 203b and 203c are disposed at predetermined positions in the light emitting layer 113 based on the cavity peak of the emitting material layers 203a, 203b and 203c as well as the effective emission region B of the light emitting layer 113, the light extraction efficiency further increases.

As a result, the light efficiency and the lifetime of the OLED display device 100 are further improved.

Figure 3:
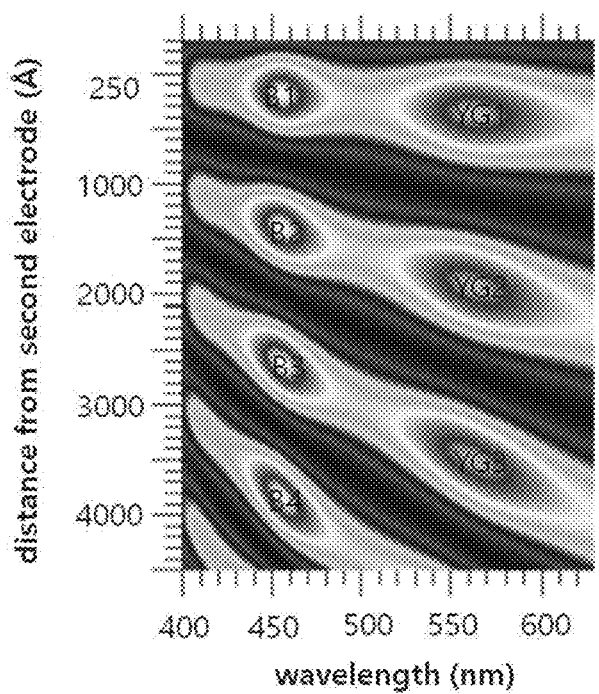
FIG. 3 is a contour map showing a light of an organic light emitting diode display device according to a comparison example.
Figure 4:
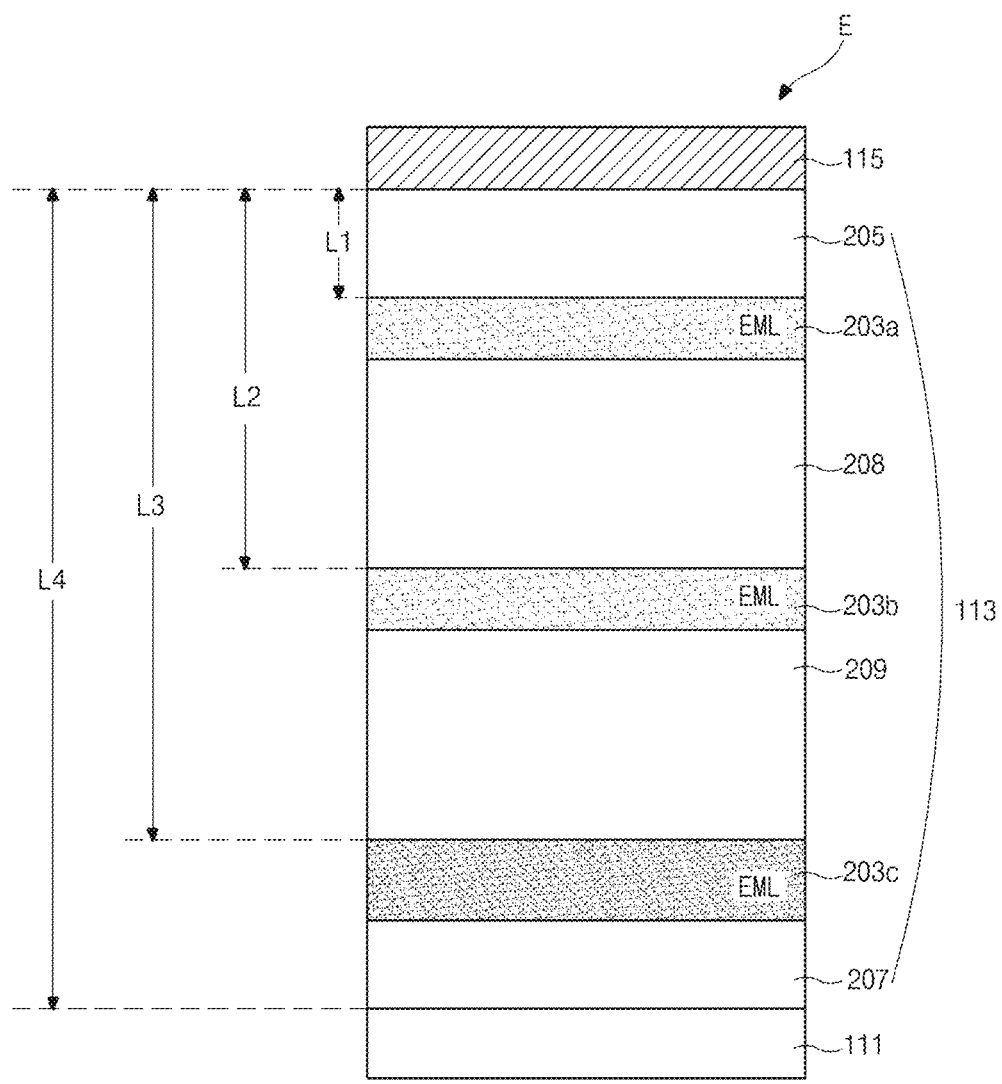
FIG. 4 is a cross-sectional view showing a light emitting diode of an organic light emitting diode display device according to a second embodiment of the present disclosure.
Figure 5:
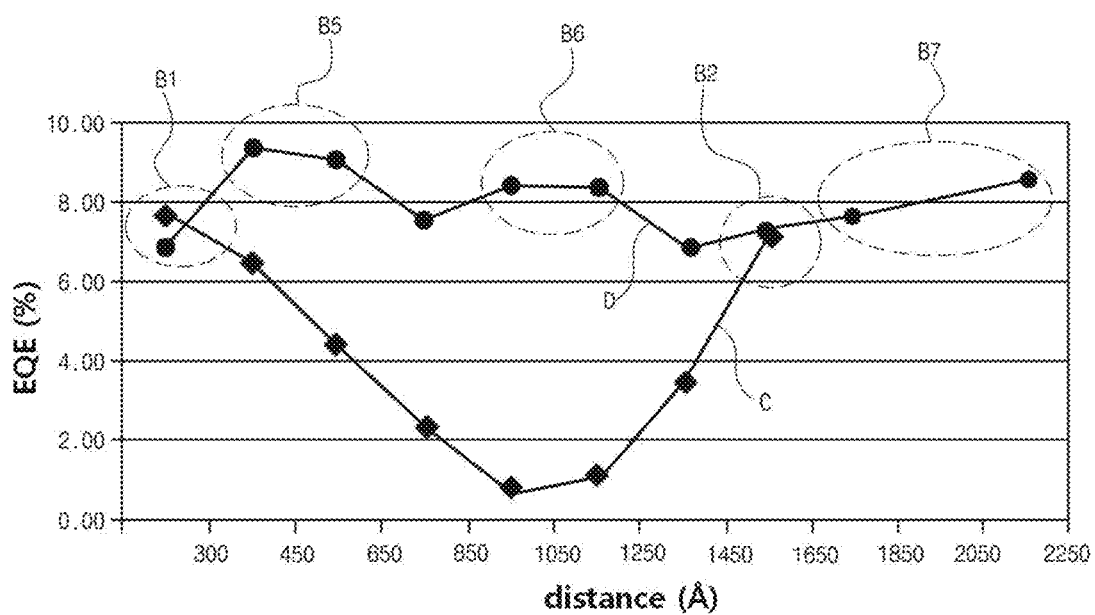
FIG. 5 is a graph showing an external quantum efficiency of a blue colored light of an organic light emitting diode display device according to a second embodiment of the present disclosure.

FIG. 3 is a contour map showing a light of an organic light emitting diode display device according to a comparison example, FIG. 4 is a cross-sectional view showing a light emitting diode of an organic light emitting diode display device according to a second embodiment of the present disclosure, and FIG. 5 is a graph showing an external quantum efficiency of a blue colored light of an organic light emitting diode display device according to a second embodiment of the present disclosure.

In FIG. 3, a contour map shows an intensity of a light according to a color (a wavelength) and a position as a contour line in an OLED display device according to a comparison example where each of a first electrode, a light emitting layer and a second electrode has a flat shape. The x-axis represents a wavelength (color) of a light and the y-axis represents a distance from the second electrode.

When emitting material layers emitting colored lights are disposed at positions having a relative maximum intensity for corresponding wavelengths, the light efficiency increases.

The light emitting layer emits a white light by mixing a blue colored light having a wavelength of 440 nm to 480 nm and a yellow-green colored light having a wavelength of 510 nm to 590 nm. According to the contour map, the blue colored light having a wavelength of 440 nm to 480 nm has cavity peaks at positions having distances of 250 Å, 1500 Å, 2700 Å and 4000 Å from the second electrode. The cavity peaks can be defined as first, second, third and fourth blue cavity peaks B1, B2, B3 and B4.

The yellow-green colored light having a wavelength of 510 nm to 590 nm has cavity peaks at positions having distances of 300 Å, 1800 Å and 3400 Å from the second electrode. The cavity peaks can be defined as first, second and third yellow-green cavity peaks YG1, YG2 and YG3.

The light emitting layer can includes two blue emitting material layers each emitting a blue colored light and one yellow-green emitting material layer emitting a yellow-green colored light for increasing a luminance of the blue colored light. Since the blue colored light having a relatively short wavelength has a relatively low emission efficiency due to a material property, the emission efficiency of the blue colored light can be a half of the emission efficiency of the yellow-green colored light. As a result, the uniform white colored light can be generated from combination of the two blue emitting material layers and one yellow-green emitting material layer.

Accordingly, when each of first and second blue emitting material layers emitting the blue colored light is disposed to correspond to one of the first, second, third and fourth blue cavity peaks B1, B2, B3 and B4 and a yellow-green emitting material layer emitting the yellow-green light is disposed to correspond to one of the first, second and third yellow-green peaks YG1, YG2 and YG3, the first and second blue emitting material layers and the yellow-green emitting material layer of the light emitting layer can have a maximum emission efficiency.

In addition, as the first and second blue emitting material layers and the yellow-green emitting material layer are disposed closer to the second electrode, a total thickness of the light emitting diode is reduced and the emission efficiency further increases. For example, based on thicknesses of organic layers such as a hole transporting layer and an electron transporting layer between the emitting material layers, the first and second blue emitting material layers can be disposed to correspond to the first and third blue cavity peaks B1 and B3, respectively, and the yellow-green emitting material layer can be disposed to correspond to the second yellow-green cavity peak YG2.

When the first blue emitting material layer is disposed to correspond to the first blue cavity peak B1 and the yellow-green emitting material layer is disposed to correspond to the first yellow-green cavity peak YG1, it is difficult to dispose the organic layers between the first blue emitting material layer and the yellow-green emitting material layer because the first blue emitting material layer and the yellow-green emitting material layer are separated by a short distance.

Further, when the first blue emitting material layer is disposed to correspond to the second blue cavity peak B2 and the yellow-green emitting material layer is disposed to correspond to the second yellow-green cavity peak YG2, it is difficult to dispose the organic layers between the first blue emitting material layer and the yellow-green emitting material layer because the first blue emitting material layer and the yellow-green emitting material layer are separated by a short distance.

As a result, the first and second blue emitting material layers can be disposed to correspond to the first and third blue cavity peaks B1 and B3, respectively, and the yellow-green emitting material layer can be disposed to correspond to the second yellow-green cavity peak YG2.

Accordingly, in the OLED display device according to a comparison example where the first electrode, the light emitting layer and the second electrode have a flat shape, the maximum emission efficiency is obtained by disposing the first and second blue emitting material layers and the yellow-green emitting material layer to correspond to the cavity peaks, i.e., disposing the first blue emitting material layer emitting a blue colored light to have a distance of 250 Å from the second electrode, disposing the second blue emitting material layer emitting a blue colored light to have a distance of 2700 Å from the second electrode and disposing the yellow-green emitting material layer emitting a yellow-green colored light to have a distance of 1800 Å from the second electrode.

In the OLED display device 100 (of FIG. 1) according to a first embodiment of the present disclosure where the first electrode 111 (of FIG. 1), the light emitting layer 113 (of FIG. 1) and the second electrode 115 (of FIG. 1) constitute a microlens ML (of FIG. 1) for improving a light extraction efficiency, since the light emitting layer 113 has a relatively small thickness in the effective emission region B (of FIG. 2), the first blue emitting material layer can have a distance of 260 Å to 460 Å from the second electrode 115, the second blue emitting material layer can have a distance of 3500 Å from the second electrode 115 and the yellow-green emitting material layer can have a distance of 2500 Å from the second electrode 115 based on the contour map for compensating the relatively small thickness of the light emitting layer 113 in the effective emission region B.

As a result, in the OLED display device 110 according to a first embodiment where the first electrode 111, the light emitting layer 113 and the second electrode 115 constitute a microlens ML (of FIG. 1), the first blue emitting material layer, the yellow-green emitting material layer and the second blue emitting material layer of the blue/yellow-green/blue colored lights are sequentially disposed under the second electrode 115.

In a light emitting diode E (of FIG. 1) of an organic light emitting diode (OLED) display device 100 (of FIG. 1) according to a second embodiment of the present disclosure, the maximum emission efficiency is obtained and a total thickness of the light emitting diode E is reduced by disposing first, second and third emitting material layers emitting blue, blue and yellow-green colored lights, respectively, sequentially under a second electrode 115 (of FIG. 1) to satisfy cavity peaks. As a result, the maximum emission efficiency is obtained and a total thickness of the light emitting diode E is reduced.

In FIG. 4, a light emitting diode E includes first and second electrodes 111 and 115 and a light emitting layer 113 between the first and second electrodes 111 and 115, and the light emitting layer 113 includes first, second and third emitting material layers (EMLs) 203a, 203b and 203c and first and second auxiliary layers 208 and 209 among the first, second and third emitting material layers (EMLs) 203a, 203b and 203c.

The first electrode 111 can be an anode supplying a hole and having a relatively great or large work function. For example, the first electrode 111 can include one of a metal oxide such as indium tin oxide (ITO) and indium zinc oxide (IZO), a mixture of a metal and an oxide such as zinc oxide and aluminum (ZnO:Al) and tin oxide and antimony (SnO$_2$:Sb) and a conductive polymer such as poly(3-methylthiophene), poly[3,4-(ethylene-1,2-dioxy)thiophene](PEDT), polypyrrole and polyaniline. In addition, the first electrode 111 can include one of carbon nano tube (CNT), graphene and silver nano wire.

The second electrode 115 can be a cathode supplying an electron and having a relatively small work function. For example, the second electrode 115 can have a single layer of an alloy of a first metal (e.g., Ag) having a relatively small work function and a second metal (e.g., Mg), a double layer of the first and second metals, or a multiple layer of the alloy of the first and second metals.

The second electrode 115 can be a reflective electrode and the first electrode 111 can be a transflective electrode. Alternatively, the first electrode 111 can be a reflective electrode and the second electrode 115 can be a transparent electrode. For example, at least one of the first and second electrodes 111 and 115 can be a reflective electrode.

The second electrode 115 can include a material having a reflectance equal to or greater than 90% in a visible ray band, and the first electrode 111 can include a material having a transmittance equal to or greater than 80% in the visible ray band. For example, the visible ray band can be a wavelength band of 380 nm to 800 nm.

When the second electrode 115 has a reflectance equal to or greater than 90%, most of a light from the light emitting layer 113 to the second electrode 115 can be reflected by the second electrode 115 to proceed toward the first electrode 111 in the light emitting diode E. In addition, when the first electrode 111 has a transmittance equal to or greater than 80%, a large amount of the light can pass through the first electrode 111.

The second electrode 115 can have a thickness of 90 nm to 120 nm for increasing a reflectance in the visible ray band. However, a thickness of the second electrode 115 is not limited thereto and can vary according to a material of the second electrode 115. The first electrode 111 can have a thickness of 115 nm to 135 nm for increasing a transmittance in the visible ray band. However, a thickness of the first electrode 111 is not limited thereto and can vary according to a material of the first electrode 111. In embodiments, a thickness of at least one of the first electrode 111 and the second electrode 115 corresponding to the plurality of convex portions 117 can be smaller than a thickness of the at least one of the first electrode 111 and the second electrode 115 corresponding to the plurality of concave portions 118.

A first electron transporting layer (ETL1) 205 is disposed between the second electrode 115 and the first emitting material layer 203*a*, and a first auxiliary layer 208 is disposed between the first emitting material layer 203*a* and the second emitting material layer 203*b*. A second auxiliary layer 209 is disposed between the second emitting material layer 203*b* and the third emitting material layer 203*c*, and a first hole transporting layer (HTL1) 207 is disposed between the third emitting material layer 203*c* and the first electrode 111.

An electron injecting layer (EIL) (not shown) can be disposed between the second electrode 115 and the first electron transporting layer (ETL) 205. The electron injecting layer can assist injection of the electron from the second electrode 115 to the first electron transporting layer (ETL1) 205.

The first electron transporting layer (ETL1) 205 can have at least two layers or can include at least two materials. A hole blocking layer (HBL) (not shown) can be disposed between the first electron transporting layer (ETL1) 205 and the first emitting material layer 203*a*. Since the hole blocking layer prevents transmission of a hole injected into the first emitting material layer 203*a* to the first electron transporting layer (ETL) 205, combination of a hole and an electron is improved in the first emitting material layer 203*a* and an emission efficiency of the first emitting material layer 203*a* is improved.

The first electron transporting layer (ETL1) 205 and the hole blocking layer can be formed as a single layer. The electron injecting layer, the first electron transporting layer (ETL) 205 and the hole blocking layer can be referred to as an electron transmitting layer.

An electron is supplied from the second electrode 115 to the first emitting material layer 203*a* through the first electron transporting layer (ETL) 205, and a hole is supplied from the first auxiliary layer 208 to the first emitting material layer 203*a*. The electron supplied through the first electron transporting layer (ETL) 205 and the hole supplied from the first auxiliary layer 208 are recombined in the first emitting material 203*a* to generate a light.

The first auxiliary layer 208 can include a second hole transporting layer (HTL2) (not shown) adjacent to the first emitting material layer 203*a* and a second electron transporting layer (ETL2) (not shown) adjacent to the second emitting material layer 203*b*.

A hole injecting layer (HIL) (not shown) can be disposed between the second hole transporting layer and the second emitting material layer 203*b*, and an electron injecting layer (EIL) (not shown) can be disposed between the second electron transporting layer and the first emitting material layer 203*a*.

An electron blocking layer (EBL) (not shown) can be disposed between the first emitting material layer 203*a* and the second hole transporting layer. Since the electron blocking layer (EBL) prevents transmission of an electron injected into the first emitting material layer 203*a* to the second hole transporting layer, combination of a hole and an electron is improved in the first emitting material layer 203*a* and an emission efficiency of the first emitting material layer 203*a* is improved.

A hole blocking layer (HBL) (not shown) can be disposed between the second electron transporting layer and the second emitting material layer 203*b*. Since the hole blocking layer prevents transmission of a hole injected into the second emitting material layer 203*b* to the second electron transporting layer, combination of a hole and an electron is improved in the second emitting material layer 203*b* and an emission efficiency of the second emitting material layer 203*b* is improved.

The electron blocking layer (EBL) and the second hole transporting layer can be formed as a single layer, and the second electron transporting layer and the hole blocking layer can be formed as a single layer. The hole injecting layer, the second hole transporting layer and the electron blocking layer (EBL) can be referred to as a hole transporting layer, and the electron injecting layer, the second electron transporting layer and the hole blocking layer can be referred to as an electron transmitting layer.

A first charge generating layer (CGL1) can be disposed between the second hole transporting layer and the second electron transporting layer of the first auxiliary layer 208. The first charge generating layer can adjust a charge balance between the first emitting material layer 203*a* and the second emitting material layer 203*b*. For example, the hole injecting layer can be disposed between the second hole transporting layer and the first charge generating layer, and the electron injecting layer can be disposed between the first charge generating layer and the second electron transporting layer.

The first charge generating layer can include a positive type charge generating layer (P-CGL) and a negative type charge generating layer (N-CGL). The positive type charge generating layer can supply a hole to the first emitting material layer 203*a*, and the negative type charge generating layer can supply an electron to the second emitting material layer 203*b*.

An electron is supplied from the first auxiliary layer 208 to the second emitting material layer 203*b*, and a hole is supplied from the second auxiliary layer 209 to the second emitting material layer 203*b*. The electron supplied from the first auxiliary layer 208 and the hole supplied from the second auxiliary layer 209 are recombined in the second emitting material 203*b* to generate a light.

The second auxiliary layer 209 can include a third hole transporting layer (HTL3) adjacent to the second emitting material layer 203*b* and a third electron transporting layer (ETL3) adjacent to the third emitting material layer 203*c*.

A hole injecting layer (HIL) can be disposed between the third hole transporting layer (HTL3) and the third emitting material layer 203*c*, and an electron injecting layer (EIL) can be disposed between the third electron transporting layer and the second emitting material layer 203*b*.

An electron blocking layer (EBL) can be disposed between the second emitting material layer 203*b* and the third hole transporting layer (HTL3). Since the electron blocking layer (EBL) prevents transmission of an electron injected into the third second emitting material layer 203*b* to the third hole transporting layer (HTL3), combination of a hole and an electron is improved in the second emitting material layer 203*b* and an emission efficiency of the second emitting material layer 203*b* is improved.

A hole blocking layer (HBL) can be disposed between the third electron transporting layer and the third emitting material layer 203*c*. Since the hole blocking layer prevents transmission of a hole injected into the third emitting material layer 203*c* to the third electron transporting layer, combination of a hole and an electron is improved in the third emitting material layer 203*c* and an emission efficiency of the third emitting material layer 203*c* is improved.

The electron blocking layer (EBL) and the third hole transporting layer (HTL3) can be formed as a single layer, and the third electron transporting layer and the hole blocking layer can be formed as a single layer. The hole injecting layer, the third hole transporting layer (HTL3) and the electron blocking layer (EBL) can be referred to as a hole transporting layer, and the electron injecting layer, the third electron transporting layer and the hole blocking layer can be referred to as an electron transmitting layer.

A second charge generating layer (CGL2) can be disposed between the third hole transporting layer (HTL3) and the third electron transporting layer of the second auxiliary layer 209. The second charge generating layer can adjust a charge balance between the second emitting material layer 203b and the third emitting material layer 203c. For example, the hole injecting layer can be disposed between the third hole transporting layer (HTL3) and the second charge generating layer, and the electron injecting layer can be disposed between the second charge generating layer and the third electron transporting layer.

The second charge generating layer can include a positive type charge generating layer (P-CGL) and a negative type charge generating layer (N-CGL). The positive type charge generating layer can supply a hole to the second emitting material layer 203b, and the negative type charge generating layer can supply an electron to the third emitting material layer 203c.

An electron is supplied from second auxiliary layer 209 to the third emitting material layer 203c, and a hole is supplied from the first electrode 111 to the third emitting material layer 203c through the first hole transporting layer (HTL1) 207. The electron supplied from the second auxiliary layer 209 and the hole supplied through the first hole transporting layer (HTL1) 207 are recombined in the third emitting material 203c to generate a light.

In the light emitting layer 113 of the OLED display device 100 according to the second embodiment of the present disclosure, each of the first and second emitting material layers adjacent to the second electrode 115 emits one of a blue colored light and a sky-blue colored light having a wavelength of 440 nm to 480 nm, and the third emitting material layer 203c adjacent to the first electrode 111 emits a yellow-green colored light having a wavelength of 510 nm to 590 nm. As a result, the light emitting diode E emits a white light by mixing the blue colored light and the yellow-green colored light from the first, second and third emitting material layers 203a, 203b and 204c.

The first and second emitting material layers 203a and 203b emitting the blue colored light have a relatively low emission efficiency as compared with the third emitting material layer 203c emitting the yellow-green colored light. Since two of the first and second emitting material layers 203a and 203b emit the blue colored light and one of the third emitting material layer 203c emits the yellow-green colored light, a luminance of the blue colored light of a relatively low emission efficiency increases and a uniform white light is obtained.

In the a light emitting diode E of the organic light emitting diode (OLED) display device 100 according to the second embodiment of the present disclosure, the first, second and third emitting material layers 203a, 203b and 203c emitting blue, blue and yellow-green colored lights, respectively, are sequentially disposed under the second electrode 115.

Each of the first, second and third emitting material layers 203a, 203b and 203c can include at least one host and at least one dopant or a mixed host where at least two hosts are mixed and at least one dopant. When the mixed host includes a host having a hole transporting property and a host having an electron transporting property, a charge balance of each of the first, second and third emitting material layers 203a, 203b and 203c can be adjusted and an efficiency of each of the first, second and third emitting material layers 203a, 203b and 203c can be improved. The dopant can include a fluorescent dopant or a phosphorescent dopant.

Here, the first, second and third emitting material layers 203a, 203b and 203c emitting blue, blue and yellow-green colored lights, respectively, are disposed at positions having a maximum emission efficiency in an effective emission region B (of FIG. 2) of the light emitting layer 113 constituting a microlens ML (of FIG. 2).

In FIG. 5, the blue colored light of the light emitting layer 113 constituting the microlens ML with the first and second electrodes 111 and 115 has additional fifth, sixth and seventh blue cavity peaks B5, B6 and B7 between the first and second blue cavity peaks B1 and B2 (of FIG. 3).

The x-axis represents a distance from the second electrode 115 and the y-axis represents an external quantum efficiency (EQE). The EQE is an external light efficiency which is an emission efficiency when a light is emitted from the first and second emitting material layers 203a and 203b to an exterior. Relative maximum values of the EQE correspond to the cavity peaks.

A curve C represents an experimental result obtained by measuring the EQE of the emitting material layer emitting the blue colored light with respect to the distance from the second electrode in the OLED display device according to the comparison example where the first electrode, the light emitting layer and the second electrode have a flat shape. A curve D represents an experimental result obtained by measuring the EQE of the emitting material layer 203a and 203b emitting the blue colored light with respect to the distance from the second electrode 115 in the OLED display device 100 according to the second embodiment of the present disclosure.

The curve C has the first and second blue cavity peaks B1 and B2 having a relatively strong EQE at the distance of 250 Å and 1500 Å, respectively, from the second electrode. The curve D has the fifth, sixth and seventh blue cavity peaks B5, B6 and B7 as well as the first and second blue cavity peaks B1 and B2 The fifth blue cavity peak B5 can correspond to the distance of a range of 350 Å to 460 Å from the second electrode 115, the sixth blue cavity peak B6 can correspond to the distance of a range of 1000 to 1300 Å from the second electrode 115, and the seventh blue cavity peak B7 can correspond to the distance of a range of 1700 Å to 2300 Å from the second electrode 115.

In the OLED display device 100 where the first electrode 111, the light emitting layer 113 and the second electrode 115 constitute the microlens ML for increasing the EQE, the additional fifth, sixth and seventh blue cavity peaks B5, B6 and B7 can be generated due to partial distortion of the distance and the position of the emitting material layer 203a and 203b for the blue cavity peak by the microlens ML.

As a result, the first, second and third emitting material layers 203a, 203b and 203c can satisfy the cavity peaks by disposing the second emitting material layer 203b emitting the blue colored light to correspond to one of the fifth, sixth and seventh blue cavity peaks B5, B6 and B7 added by the microlens ML. As a result, the maximum emission efficiency is obtained in the OLED display device 100 according to the second embodiment of the present disclosure.

In the light emitting diode E according to the second embodiment, the first emitting material layer 203a emitting the blue colored light can be disposed between the second electrode 115 and the second emitting material layer 203a emitting the blue colored light to correspond to one of the first and fifth blue cavity peaks B1 and B5.

For example, the first emitting material layer 203a can be separated from a bottom surface of the second electrode 115 of a cathode by a first distance L1 within a range of 290 Å to 460 Å.

The second emitting material layer 203b emitting the blue colored light can be disposed between the first emitting material layer 203a emitting the blue colored light and the third emitting material layer 203c emitting the yellow-green colored light to correspond to one of sixth and seventh blue cavity peaks B6 and B7.

For example, the second emitting material layer 203b can be separated from a bottom surface of the second electrode 115 of a cathode by a second distance L2 within a range of 1060 Å to 1260 Å or within a range of 1860 Å to 2260 Å.

The third emitting material layer 203c emitting the yellow-green colored light can be disposed adjacent to the first electrode 111 as compared with the first and second emitting material layers 203a and 203b emitting the blue colored light to correspond to the second yellow-green cavity peaks YG2 (of FIG. 3).

For example, the third emitting material layer 203c can be separated from a bottom surface of the second electrode 115 of a cathode by a third distance L3 within a range of 2500 Å to 2700 Å.

In the OLED display device 100 according to the second embodiment of the present disclosure, the first emitting material layer 203a emitting the blue colored light can be disposed to correspond to one of the first and fifth blue cavity peaks B1 and B5. The second emitting material layer 203b emitting the blue colored light can be disposed to correspond to one of the sixth and seventh blue cavity peaks B6 and B7. The third emitting material layer 203c emitting the yellow-green colored light can be disposed to correspond to the second yellow-green cavity peak YG2.

Since the first, second and third emitting material layers 203a, 203b and 203c are disposed to correspond to the cavity peaks, the maximum emission efficiency can obtained in the OLED display device 100 where the first electrode 111, the light emitting layer 113 and the second electrode 115 constituting the microlens ML.

Specifically, the first emitting material layer 203a can be disposed at a position of the first distance L1 within a range of 290 Å to 460 Å, the second emitting material layer 203b can be disposed at a position of the second distance L2 within a range of 1060 Å to 1260 Å or within a range of 1860 Å to 2260 Å, and the third emitting material layer 203c can be disposed at a position of the third distance L3 within a range of 2500 Å to 2700 Å. As a result, the maximum emission efficiency is obtained, and a total thickness of the light emitting layer 113 is reduced at the same time. For example, the light emitting layer 113 can have the total thickness smaller than 4000 Å, e.g., the thickness within a range of 3600 Å to 4000 Å.

In the OLED display device 100 according to the second embodiment of the present disclosure, since the first electrode 111, the light emitting layer 113 and the second electrode 115 constitute the microlens ML, the light extraction efficiency increases. In addition, since the first, second and third emitting material layers 203a, 203b and 203c are disposed to correspond to the cavity peaks based on the effective emission region B of the light emitting layer 113 constituting the microlens ML, each of the first, second and third emitting material layers 203a, 203b and 203c has the maximum emission efficiency and the emission efficiency of the OLED display device 100 further increases.

Further, the total thickness of the light emitting layer 113 of the OLED display device 100 is reduced with increase of the light extraction efficiency and the emission efficiency.

When the thickness of the light emitting layer 113 increases, the emission efficiency of the light emitting diode E is reduced due to absorption of the light from the first, second and third emitting material layers 203a, 203b and 203c by the organic layer, or the process efficiency is reduced such that the fabrication time for the light emitting layer 113 increases. In the OLED display device 100 according to the second embodiment of the present disclosure, since the fourth thickness LA of the light emitting layer 113 is reduced, the reduction in emission efficiency and process efficiency is prevented.

In addition, since the distances from the second electrode 115 to the emitting material layers 203a, 203b and 203c in the concave portions 118 (of FIG. 2) of the light emitting layer 113 constituting the microlens ML are determined different from the distances from the second electrode 115 to the emitting material layers 203a, 203b and 203c in the effective emission region B of the side surface portion 117c (of FIG. 2) of the convex portions 117 (of FIG. 2), the emitting material layers 203a, 203b and 203c are disposed to satisfy the cavity peaks of the optical property based on the effective emission region B (of FIG. 2) of the light emitting layer 113. As a result, the light extraction efficiency of the OLED display device 100 increases.

Further, since the total thickness of the light emitting layer 113 and/or the light emitting diode E is reduced, the reduction in emission efficiency and process efficiency is prevented.

The present disclosure also relates to and is not limited to the following aspects.

In the present disclosure, an organic light emitting diode display device includes: an overcoating layer on a substrate having an emitting area and a non-emitting area and including a plurality of convex portions and a plurality of concave portions; a first electrode on the overcoating layer; a light emitting layer on the first electrode; and a second electrode on the light emitting layer, wherein the light emitting layer includes first, second and third emitting material layers sequentially under the second electrode, and wherein the first emitting material layer emits a first light of a first wavelength, the second emitting material layer emits the first light of the first wavelength, and the third emitting material layer emits a second light of a second wavelength different from the first wavelength.

In the present disclosure, the first wavelength is within a range of 440 nm to 480 nm, and the second wavelength is within a range of 510 nm to 590 nm.

In the present disclosure, the first emitting material layer is disposed to have a distance of 290 Å to 460 Å from a bottom surface of the second electrode.

In the present disclosure, the second emitting material layer is disposed to have a distance of 1060 Å to 1260 Å from a bottom surface of the second electrode.

In the present disclosure, the second emitting material layer is disposed to have a distance of 1860 Å to 2260 Å from a bottom surface of the second electrode.

In the present disclosure, the third emitting material layer is disposed to have a distance of 2500 Å to 2700 Å from a bottom surface of the second electrode.

In the present disclosure, the light emitting layer has a thickness within a range of 3600 Å to 4000 Å.

In the present disclosure, a thickness of the light emitting layer corresponding to the plurality of convex portions is smaller than a thickness of the light emitting layer corresponding to the plurality of concave portions.

In the present disclosure, the first light includes one of a blue colored light and a sky-blue colored light, and the second light includes a yellow-green light.

In the present disclosure, a thickness of at least one of the first electrode and the second electrode corresponding to the plurality of convex portions is smaller than a thickness of the at least one of the first electrode and the second electrode corresponding to the plurality of concave portions.

In the present disclosure, each convex portion has a cross-section of a triangle shape including a vertex, a bottom side and a hypotenuse.

In the present disclosure, an angle of the hypotenuse of each convex portion gradually increase from a bottom side to the vertex.

In the present disclosure, the organic light emitting diode display device further includes a wavelength converting layer interposed between the substrate and the overcoating layer, and an edge portion of the wavelength converting layer extends beyond an edge portion of the plurality of convex portions and the plurality of concave portions toward the non-emitting area In the present disclosure, the organic light emitting diode display device further includes a bank on the overcoating layer, and including an opening exposing the first electrode, and the plurality of convex portions and the plurality of concave portions are formed in the opening.

In the present disclosure, the plurality of convex portions and the plurality of concave portions contact an edge portion of the bank, and the bank overlays an edge portion of the plurality of convex portions and the plurality of concave portions In the present disclosure, an edge portion of the wavelength converting layer, an edge portion of the plurality of convex portions and the plurality of concave portions and an edge portion of the bank overlap one another in the non-emitting area.

In the present disclosure, a border portion of the emitting area and the non-emitting area overlaps an edge portion of the plurality of convex portions and the plurality of concave portions.

In the present disclosure, an organic light emitting diode display device includes: an overcoating layer on a substrate and including a plurality of convex portions and a plurality of concave portions that are integrally formed in the overcoating layer; and a light emitting layer on the overcoating layer and including first, second and third emitting material layers, wherein the first emitting material layer emits a first light of a first wavelength, the second emitting material layer emits the first light of the first wavelength, and the third emitting material layer emits a second light of a second wavelength different from the first wavelength, and wherein the first, second and third lights confined in an interior of the light emitting layer due to a total reflection is transmitted with an angle smaller than a critical angle of the total reflection by the overcoating layer to be extracted to an exterior by a multiple reflection.

In the present disclosure, the organic light emitting diode display device further includes: a first electrode on the overcoating layer; and a second electrode on the light emitting layer, and the first, second and third emitting material layers are sequentially stacked under the second electrode.

In the present disclosure, the first wavelength is within a range of 440 nm to 480 nm, and the second wavelength is within a range of 510 nm to 590 nm.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode display device, comprising:
    an overcoating layer on a substrate having an emitting area and a non-emitting area and including a plurality of convex portions and a plurality of concave portions;
    a first electrode on the overcoating layer;
    a light emitting layer on the first electrode; and
    a second electrode on the light emitting layer,
    wherein the light emitting layer includes first, second and third emitting material layers sequentially under the second electrode,
    wherein the first emitting material layer emits a first light of a first wavelength, the second emitting material layer emits the first light of the first wavelength, and the third emitting material layer emits a second light of a second wavelength different from the first wavelength,
    wherein the first light includes one of a blue colored light and a sky-blue colored light, wherein the second emitting material layer emitting the first light of the first wavelength is disposed to have a distance within one of a range of 1060 Å to 1260 Å and a range of 1860 Å to 2260 Å from a bottom surface of the second electrode, and
    wherein a thickness of at least one of the first electrode and the second electrode corresponding to the plurality of convex portions is smaller than a thickness of the at least one of the first electrode and the second electrode corresponding to the plurality of concave portions.

2. The organic light emitting diode display device of claim 1, wherein the first wavelength is within a range of 440 nm to 480 nm, and the second wavelength is within a range of 510 nm to 590 nm.

3. The organic light emitting diode display device of claim 1, wherein the first emitting material layer is disposed to have a distance within a range of 290 Å to 460 Å from the bottom surface of the second electrode.

4. The organic light emitting diode display device of claim 1, wherein the third emitting material layer is disposed to have a distance within a range of 2500 Å to 2700 Å from the bottom surface of the second electrode.

5. The organic light emitting diode display device of claim 1, wherein the light emitting layer has a thickness within a range of 3600 Å to 4000 Å.

6. The organic light emitting diode display device of claim 1, wherein a thickness of the light emitting layer corresponding to the plurality of convex portions is smaller than a thickness of the light emitting layer corresponding to the plurality of concave portions.

7. The organic light emitting diode display device of claim 1, wherein the second light includes a yellow-green light.

8. The organic light emitting diode display device of claim 1, wherein each convex portion has a cross-section of a triangle shape including a vertex, a bottom side and a hypotenuse.

9. The organic light emitting diode display device of claim 8, wherein an angle of the hypotenuse of each convex portion gradually increase from the bottom side to the vertex.

10. The organic light emitting diode display device of claim 1, further comprising a wavelength converting layer interposed between the substrate and the overcoating layer,
wherein an edge portion of the wavelength converting layer extends beyond an edge portion of the plurality of convex portions and the plurality of concave portions toward the non-emitting area.

11. The organic light emitting diode display device of claim 10, further comprising a bank on the overcoating layer, and including an opening exposing the first electrode,
wherein the plurality of convex portions and the plurality of concave portions are formed in the opening.

12. The organic light emitting diode display device of claim 11, wherein the plurality of convex portions and the plurality of concave portions contact an edge portion of the bank, and
wherein the bank overlays an edge portion of the plurality of convex portions and the plurality of concave portions.

13. The organic light emitting diode display device of claim 11, wherein an edge portion of the wavelength converting layer, an edge portion of the plurality of convex portions and the plurality of concave portions and an edge portion of the bank overlap one another in the non-emitting area.

14. The organic light emitting diode display device of claim 1, wherein a border portion of the emitting area and the non-emitting area overlaps an edge portion of the plurality of convex portions and the plurality of concave portions.

15. An organic light emitting diode display device, comprising:
an overcoating layer on a substrate and including a plurality of convex portions and a plurality of concave portions that are integrally formed in the overcoating layer; and
a light emitting layer on the overcoating layer and including first, second and third emitting material layers,
wherein the first emitting material layer emits a first light of a first wavelength, the second emitting material layer emits the first light of the first wavelength, and the third emitting material layer emits a second light of a second wavelength different from the first wavelength,
wherein the first and second lights confined in an interior of the light emitting layer due to a total reflection is transmitted with an angle smaller than a critical angle of the total reflection by the overcoating layer to be extracted to an exterior by a multiple reflection,
wherein the first light includes one of a blue colored light and a sky-blue colored light,
wherein the second emitting material layer emitting the first light of the first wavelength is disposed to have a distance within one of a range of 1060 Å to 1260 Å and a range of 1860 Å to 2260 Å from a bottom surface of the second electrode, and
wherein a thickness of at least one of a first electrode and a second electrode corresponding to the plurality of convex portions is smaller than a thickness of the at least one of the first electrode and the second electrode corresponding to the plurality of concave portions.

16. The organic light emitting diode display device of claim 15, further comprising:
the first electrode on the overcoating layer; and
the second electrode on the light emitting layer,
wherein the first, second and third emitting material layers are sequentially stacked under the second electrode.

17. The organic light emitting diode display device of claim 15, wherein the first wavelength is within a range of 440 nm to 480 nm, and the second wavelength is within a range of 510 nm to 590 nm.

18. The organic light emitting diode display device of claim 1, further comprising:
a wavelength converting layer interposed between the substrate and the overcoating layer; and
a bank on the overcoating layer, the bank including an opening exposing the first electrode,
wherein an edge portion of the wavelength converting layer extends beyond an edge portion of the bank such that the edge portion of the wavelength converting layer and the edge portion of the bank overlap each other.

* * * * *